United States Patent
Endo et al.

(10) Patent No.: US 10,392,693 B2
(45) Date of Patent: Aug. 27, 2019

(54) LAMINATE STRUCTURE AND MANUFACTURING METHOD THEREOF

(71) Applicant: JX Nippon Mining & Metals Corporation, Tokyo (JP)

(72) Inventors: Yousuke Endo, Ibaraki (JP); Hiroyoshi Yamamoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 125 days.

(21) Appl. No.: 15/047,072

(22) Filed: Feb. 18, 2016

(65) Prior Publication Data

US 2016/0289818 A1    Oct. 6, 2016

(30) Foreign Application Priority Data

Mar. 30, 2015 (JP) ................. 2015-070151

(51) Int. Cl.
  *C23C 14/34* (2006.01)
  *H01J 37/34* (2006.01)
  *B22D 19/00* (2006.01)

(52) U.S. Cl.
  CPC .......... *C23C 14/3414* (2013.01); *B22D 19/00* (2013.01); *H01J 37/342* (2013.01); *H01J 37/3426* (2013.01)

(58) Field of Classification Search
  CPC . C23C 14/3414; H01J 37/3426; H01J 37/342; B22D 19/00
  See application file for complete search history.

(56) References Cited

U.S. PATENT DOCUMENTS

| | | | |
|---|---|---|---|
| 4,719,959 A | 1/1988 | Susumu | |
| 8,709,548 B1* | 4/2014 | Newbery | C23C 14/3414 106/1.18 |
| 2013/0143069 A1* | 6/2013 | Endo | B23K 35/262 428/642 |
| 2014/0124365 A1* | 5/2014 | Wurczinger | C23C 14/3414 204/298.13 |
| 2016/0126072 A1 | 5/2016 | Endo | |

FOREIGN PATENT DOCUMENTS

| | | |
|---|---|---|
| JP | 61-135452 A | 6/1986 |
| JP | 1-31971 B2 | 6/1989 |
| JP | 6-91350 A | 4/1994 |
| JP | 2013253298 A * | 12/2013 |
| JP | 2014-84511 A | 5/2014 |
| WO | 2015/004958 A1 | 1/2015 |

OTHER PUBLICATIONS

Machine translation of JP-2013253298-A (Year: 2013).*
Derwent Abstract U.S. Pat. No. 8,709,548 (Year: 2014).*

* cited by examiner

*Primary Examiner* — Michael A Band
(74) *Attorney, Agent, or Firm* — Nields, Lemack & Frame, LLC

(57) ABSTRACT

A laminate structure having an indium target with the occurrence of defects being well controlled and excellent in adhesion between the indium target and a backing tube is provided. A laminate structure of an indium target and a backing tube wherein a defect area ratio at an indium-backing tube interface is 5.0% or less.

9 Claims, 1 Drawing Sheet

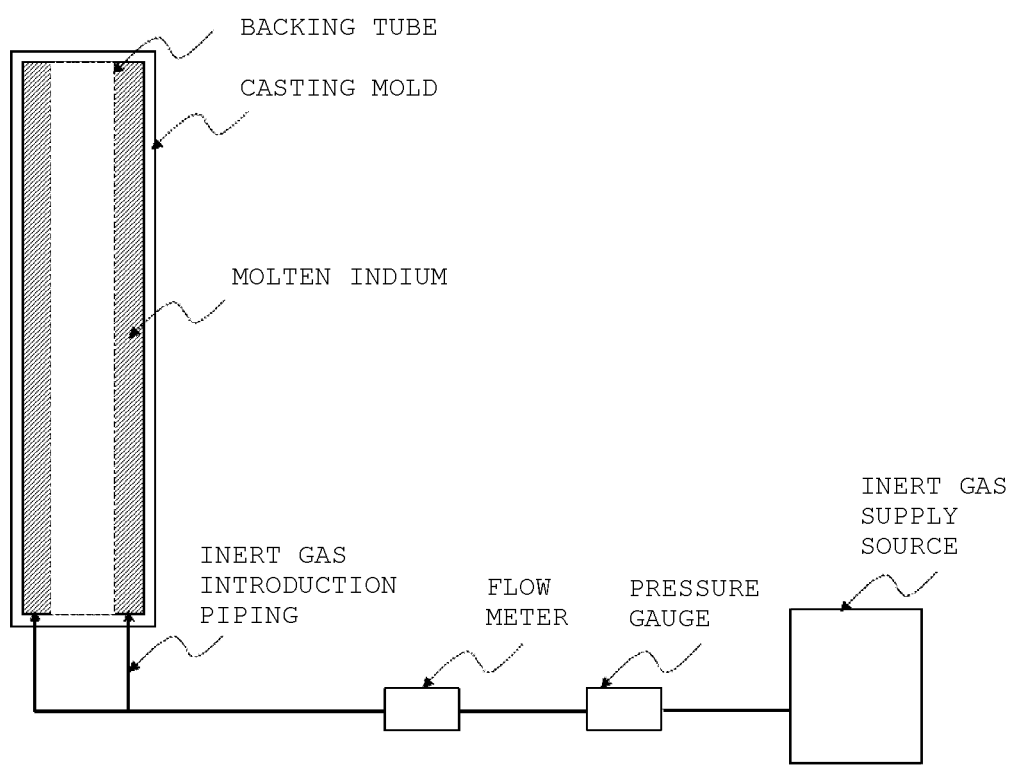

LAMINATE STRUCTURE AND MANUFACTURING METHOD THEREOF

BACKGROUND OF THE INVENTION

Field of the Invention

The present invention relates to a laminate structure and a manufacturing method thereof.

Description of the Related Art

A cylindrical indium target is typically manufactured by casting indium with a backing tube.

Various conventional methods for casting a target have been developed. For example, an apparatus for continuous casting of a hollow billet is disclosed in Japanese Patent Laid-Open No. 61-135452 as follows. A core is disposed in a hollow part with open upper and lower ends of a hollow water-cooled casting mold having a cylindrical or other cross section. A molten metal is continuously supplied into an annular casting path formed between the water-cooled casting mold and the core. Meanwhile, a pedestal disposed at first to seal the lower end of the casting path is lowered, such that an annular ingot is continuously pulled out to manufacture a hollow billet, with the solidification starting point at which the supplied molten metal is solidified in the casting path being maintained at approximately constant. The core includes: an insulation member (a) formed of insulating material having a molten metal receiving tank for temporarily receiving a molten metal to be supplied into the casting path and at least one molten metal guiding part for guiding the molten metal from the molten metal receiving tank into the casting path, which is integrally formed in the upper part; and a casting member (b) formed of graphite or carbonaceous material to form a core-side casting surface tapering downward with a smaller diameter in a downward direction in a proper vertical length range including the expected solidification starting point on the core-side, which is fixed to the insulation member.

Further, a casting method of a hollow billet is disclosed in Japanese Patent Publication No. 1-31971 as follows. In the hot top casting method, a molten metal is supplied to a casting mold from a casting furnace to a molten metal receiving tank made of insulating refractory for holding the molten metal above the casting mold through a launder (trough). A hollow billet is continuously cast with a water-cooled casting mold in which a core made of refractory is concentrically disposed. A coolant flow pipe for circulating a coolant inside the core and the temperature detecting end of a temperature detector are disposed inside the core. Corresponding to the temperature detected by the temperature detector, the flow rate or the temperature of the coolant inside the coolant flow pipe is adjusted, so that the temperature of the core is controlled.

A cylindrical indium target is made by casting molten indium into a casting mold having a backing tube inside thereof. The oxide slag contained in the molten indium is floated on the molten indium because of a lower density than indium. Accordingly, the slag rarely remains in indium. The slag often adheres to the backing tube and remains in indium in many cases. When the molten indium is cooled and solidified while the slag remainings, the oxide slag adhered to the backing tube is solidified as it is, which may cause an adhesive failure. The occurrence of the adhesive failure causes a cooling failure during sputtering, resulting in abnormal discharge and the like.

The object of the present invention is therefore to provide a laminate structure having an indium target with the occurrence of defects being well controlled and excellent in the adhesion between the indium target and the backing tube.

SUMMARY OF THE INVENTION

As a result of extensive research to solve the problem, the present inventors found that defects in a molten metal can be suppressed and an indium target excellent in the adhesion between a backing tube and the indium target can be provided by a method including the successive steps of: casting molten indium into a casting mold having a backing tube, and then bubbling an inert gas from the bottom of the casting mold so as to remove and float the oxide slag present in the molten indium and the oxides adhered to the surface of the backing tube.

An aspect of the present invention accomplished based on the above finding relates to a laminate structure of a cylindrical indium target and a backing tube, wherein a defect area ratio at an indium-backing tube interface is 5.0% or less.

In an embodiment of the laminate structure of the present invention, the defect area ratio is 3.0% or less.

In another embodiment of the laminate structure of the present invention, the defect area ratio is 1.0% or less.

In yet another embodiment of the laminate structure of the present invention, the number of internal defects having a diameter of 1 mm or more in the indium-backing tube interface is less than 0.10 pieces/cm$^3$.

Another aspect of the present invention relates to a manufacturing method of a laminate structure of an indium target and a backing tube including the steps of disposing a backing tube inside a casting mold, and melting and casting a raw material indium supplied to a gap between the casting mold and the backing tube inside the casting mold, wherein in the step of melting and casting, an inert gas is blown into the molten indium such that a slag containing oxides in the molten indium and/or a slag containing oxides adhered to the backing tube are floated to the top of the molten indium by bubbling and removed.

In an embodiment of the manufacturing method of a laminate structure of the present invention, melting and casting are performed while an inert gas is introduced in the step of melting and casting.

In an another embodiment of the manufacturing method of a laminate structure of the present invention, the step of disposing a backing tube inside a casting mold includes the steps of preparing a backing tube laminated with an indium layer and disposing the backing tube laminated with an indium layer inside the casting mold.

In yet another embodiment of the manufacturing method of a laminate structure of the present invention, the amount of an inert gas blown into the molten indium for bubbling is a flow rate Q [L/min] calculated from the following formula:

$$Q=(T+273.2)/(T_1+273.2) \times (P_1/P) \times Q_1$$

wherein T[° C.] represents the temperature of the introduced gas, P represents the pressure of the introduced gas, $T_1$ is 25 [° C.], $P_1$ is 0.2 [MPa], and $Q_1$ is 1 to 40 [L/min].

In yet another embodiment of the manufacturing method of a laminate structure of the present invention, the bubbling of an inert gas is performed for a time period of 5 minutes or more.

In yet another embodiment of the manufacturing method of a laminate structure of the present invention, the inert gas for use in the bubbling is nitrogen, argon, or a mixed gas thereof.

The present invention can provide a laminate structure having an indium target with the occurrence of defects being well controlled and excellent in the adhesion between the indium target and the backing tube.

BRIEF DESCRIPTION OF THE DRAWING

FIG. 1 is a schematic cross-sectional view of a casting apparatus in an embodiment of the present invention.

DETAILED DESCRIPTION OF THE PREFERRED EMBODIMENTS

The embodiments of the present invention are described in detail as follows.

(Construction of Laminate Structure)

The laminate structure of the present invention is a laminate structure of a cylindrical indium target and a backing tube. In other words, the laminate structure of the present invention is a laminate structure consisting of only two layers, a cylindrical indium target and a backing tube. The backing tube may be formed into a cylindrical shape having a specific thickness and a diameter, though not particularly limited. The constituent material of the backing tube may be a metal material such as titanium and stainless steel, though not particularly limited.

In the laminate structure of the present invention, the defect area ratio at an indium-backing tube interface is 1.0% or less. The defect at the indium-backing tube interface means a gap where the indium layer and the backing tube are not adhered to each other. The defect area ratio means the ratio of the defects to the surface area of the indium layer on the backing tube-side. With a defect area ratio at the indium-backing tube interface of 5.0% or less, excellent adhesion between the indium layer and the backing tube is obtained, so that the occurrence of cooling failure during sputtering can be well suppressed and the occurrence of abnormal discharge can be well suppressed. The defect area ratio at the indium-backing tube interface is preferably 3.0% or less, more preferably 1.0% or less, and typically 0.05 to 5.0%.

The defect area ratio at the indium-backing tube interface of the present invention is measured by ultrasonic flaw detection as follows. In particular, the ultrasonic flaw detection is performed using an ultrasonic flaw detector FSLINE manufactured by Hitachi Engineering Co., Ltd., so that the adhesion ratio between the backing tube and the target body is measured. To be more specific, a cylindrical indium target is set in a flaw detector tank and scanned in the longitudinal direction with a pitch of 1 mm. Subsequently, the target is rotated to have a pitch of 1 mm in the circumferential direction and scanned in the longitudinal direction with a pitch of 1 mm again. The scanning cycle is repeated to measure the whole circumference. On this occasion, a 10-MHz probe is used with a gain of 30 dB. In general, since the echo obtained in ultrasonic flaw detection varies depending on the device and probe for use and the measurement environment, standard samples for which the presence or absence of defects are known are made for measurement in advance. In particular, holes having a diameter of 1 mm are opened to reach the target from the internal surface-side of the backing tube of a cylindrical indium target, and masked to prevent water from entering the inside. The holes are used to resemble defects and subjected to the flaw detection under discriminative conditions.

In the laminate structure of the present invention, the number of internal defects with a diameter of 1 mm or more at the indium-backing tube interface is preferably less than 0.10 pieces/cm$^3$, more preferably 0.00 pieces/cm$^3$. For the measurement of the number of internal defects also, holes having a diameter of 1 mm are opened in the target of the cylindrical indium target in advance as described in the measurement method of the "defect area ratio", which can be confirmed under flaw detection conditions with a gain of 35 dB. The measurement can be in the same way as in the measurement of the "defect area ratio", for the evaluation of the number of internal defects.

(Manufacturing Method of Laminate Structure)

A preferred example of the manufacturing method of a laminate structure of the present invention is described step by step as follows. First, a backing tube is prepared. Subsequently, the backing tube is disposed inside a casting mold so as to be heated at a temperature equal to or higher than the melting point of indium. A raw material indium is then supplied into the gap between the casting mold and the backing tube so as to be melted and cast to form an indium target. For the supply of raw material, indium in a molten state may be poured in or solid indium may be melted by heating with a heater. When the raw material indium is supplied, an inert gas is preferably used as the atmosphere. With such a constitution, the formation of an oxide coating film and the like can be suppressed.

In the melting and casting, an inert gas is blown into the molten indium so that the slag containing oxides in the molten indium and/or the slag containing oxides adhered to the backing tube are floated to the top of the molten indium and removed. Such a constitution allows an indium target to be made with the occurrence of defects at the indium-backing tube interface being well suppressed.

The step of disposing the backing tube inside a casting mold may include the steps of preparing a backing tube laminated with an indium layer and disposing the backing tube laminated with an indium layer inside a casting mold. In other words, first of all, a backing tube laminated with an indium layer is prepared. On this occasion, examples of the means for laminating an indium layer on the backing tube include plating the backing tube using an indium-containing plating liquid. Subsequently the backing tube laminated with an indium layer is disposed inside a casting mold so as to be heated to a temperature equal to or higher than the melting point of indium. Raw material indium is then supplied on the indium layer of the backing tube inside a casting mold, so that the indium on the backing tube and the raw material indium are melted and casted to form an indium target.

In the bubbling process, preferably an inert gas such as nitrogen and argon is blown into the molten indium. The amount of gas to be blown in is converted to a flow Q [L/min] at 25° C. and a gas pressure of 0.2 MPa, from the records of a pressure gauge and a flow meter disposed between the gas piping to the casting mold and a gas supply source, using the following formula:

$$Q = (T+273.2)/(T_1+273.2) \times (P_1/P) \times Q_1$$

wherein T[° C.] represents the temperature of the introduced gas, P represents the pressure of the introduced gas, $T_1$ is 25 [° C.], $P_1$ is 0.2 [MPa], and $Q_1$ is 1 to 40 [L/min].

The bubbling with such an amount of gas allows the slag containing oxides to be efficiently removed. In addition, the use of an inert gas as the atmosphere before supplying molten indium further suppresses the formation of an oxide coating film.

The gas to be introduced may be preheated to prevent the temperature of a molten metal from lowering. For example, piping heated at 200° C. may be incorporated in the introduction path. The gas pressure may be set at a value larger than the own weight (=pressure) of indium when the gas is introduced, and may be about 0.1 to 0.5 MPa.

In the bubbling process, the number of the inert gas feed ports disposed on the casting mold is preferably 2 or more, more preferably 4 or more. With a plurality of inert gas feed ports disposed on the casting mold, bubbles reach the entire area of the backing tube in the circumferential direction so that the slag containing oxides can be more efficiently removed in a well-balanced manner. The bubbling time of an inert gas is preferably 5 minutes or more for the slag containing oxides to be efficiently removed.

In order to assist the oxides to float, the internal defects at the indium-backing tube interface may be suppressed. In the laminate structure of the present invention, the number of internal defects having a diameter of 1 mm or more is preferably 0.10 pieces/cm$^3$.

The supplying, melting and casting of raw material indium are performed using, for example, a casting apparatus as shown in FIG. 1. The casting apparatus shown in FIG. 1 includes a casting mold and a heater (not shown in drawing) disposed to cover the casting mold. Between a gas supply source and the casting mold, a pressure gauge (regulator) and a flow meter are disposed to control the flow. The casting mold has a cylindrical shape. A hollow backing tube is disposed inside the casting mold, and molten indium is injected between the backing tube and the cast molding. During the casting process, an inert gas such as argon and nitrogen introduced from an inert gas introduction piping is blown into the molten indium.

Subsequently, after cooling down to room temperature, an indium target is newly formed on the backing tube. The cooling rate may be a natural air cooling rate. After cooling, the surface of the target is machined to a specified size by a lathe or the like.

The laminate structure thus obtained can be preferably used as a sputtering target for the light absorption layer of a CIGS thin film solar cell.

EXAMPLES

The present invention is described in more detail with reference to Examples as follows, though the present invention is not limited thereto.

Examples 1 to 10 and Comparative Examples 1 to 5

First, using a casting apparatus as shown in FIG. 1, a backing tube laminated with an indium layer was prepared. The backing tube was disposed inside a casting mold to be heated at 200° C., which is higher than the melting point of indium. Raw material indium was then supplied onto the indium layer on the backing tube inside the casting mold. The indium on the backing tube and the supplied raw material indium were melted and casted to form an indium target in the casting atmosphere described in Table 1. In Examples 1 to 9 and Comparative Examples 1 to 5, the supply of raw material indium was performed in an air atmosphere, while in Example 10, the supply was performed in an inert gas atmosphere. In the melting and casting process, the gas (25° C.) described in Table 1 was blown into the molten indium with the gas amount and the gas pressure described in Table 1 to perform bubbling for a time period described in Table 1. Consequently the slag containing the oxides in the molten indium and the slag containing the oxides adhered to the backing tube were floated to the top of the molten indium for removal. The gas flow amount was controlled using a pressure gauge (regulator) and a flow meter disposed between a gas supply source and the casting mold.

After cooling down to room temperature by natural cooling, an indium target was newly formed on the backing tube.

The laminate structure of the cylindrical indium target and the backing tube thus manufactured was subjected to the measurement of the defect area ratio at the indium-backing tube interface, the adhesion ratio, and the internal defects as follows.

(Defect Area Ratio)

The defect area ratio at the indium-backing tube interface was measured by ultrasonic flaw detection. In particular, ultrasonic flaw detection was performed using an ultrasonic flaw detector FSLINE manufactured by Hitachi Engineering Co., Ltd., so that the defect area ratio at the indium-backing tube interface [(defect area/interface area)×100(%)] was measured. To be more specific, a cylindrical indium target was set in a flaw detector tank and scanned in the longitudinal direction with a pitch of 1 mm. Subsequently, the target was rotated to have a pitch of 1 mm in the circumferential direction and scanned in the longitudinal direction with a pitch of 1 mm again. The scanning cycle was repeated to measure the whole circumference. In the measurement, a 10-MHz probe was used with a gain of 30 dB. In general, since the echo obtained in ultrasonic flaw detection varies depending on the device and probe for use and the measurement environment, standard samples for which the presence or absence of defects were known were made for measurement in advance. In particular, holes having a diameter of 1 mm were opened to reach the target from the internal surface-side of the backing tube of a cylindrical indium target. The holes were used to resemble defects and subjected to the flaw detection under discriminative conditions.

(Internal Defect)

For the measurement of the internal defects also, holes having a diameter of 1 mm were opened in the target of the cylindrical indium target in advance as described in the measurement method of the "defect area ratio", which can be confirmed under flaw detection conditions with a gain of 35 dB. The measurement was performed in the same way as the measurement of the "defect area ratio", for the evaluation of the number of internal defects having a diameter of 1 mm or more.

The testing conditions and the evaluation results are shown in Table 1.

TABLE 1

| | Casting atmosphere | Gas | Bubbling | | | Defect area ratio [%] | Internal defect [pieces/cm$^3$] |
| | | | Gas Amount [L/min] | Gas pressure [MPa] | Bubbling time [min] | | |
|---|---|---|---|---|---|---|---|
| Example 1 | Ambient air | N$_2$ | 4 | 0.2 | 10 | 4.0 | 0.00 |
| Example 2 | Ambient air | N$_2$ | 16 | 0.2 | 10 | 1.0 | 0.00 |

TABLE 1-continued

|  | Casting atmosphere | Bubbling | | | | Defect area ratio [%] | Internal defect [pieces/cm³] |
|---|---|---|---|---|---|---|---|
|  |  | Gas | Gas Amount [L/min] | Gas pressure [MPa] | Bubbling time [min] |  |  |
| Example 3 | Ambient air | Ar | 4 | 0.2 | 10 | 4.0 | 0.00 |
| Example 4 | Ambient air | $N_2$ | 4 | 0.2 | 30 | 2.0 | 0.00 |
| Example 5 | Ambient air | $N_2$ | 4 | 0.2 | 5 | 5.0 | 0.00 |
| Example 6 | Ambient air | $N_2$ + Ar | 16 | 0.2 | 10 | 1.0 | 0.00 |
| Example 7 | Ambient air | $N_2$ | 32 | 0.2 | 10 | 0.8 | 0.00 |
| Example 8 | Ambient air | $N_2$ | 40 | 0.2 | 10 | 0.6 | 0.00 |
| Example 9 | Ambient air | $N_2$ | 1 | 0.2 | 10 | 5.0 | 0.00 |
| Example 10 | $N_2$ | $N_2$ | 4 | 0.2 | 10 | 2.0 | 0.00 |
| Comparative Example 1 | Ambient air | Air | 4 | 0.2 | 10 | 5.5 | 0.10 |
| Comparative Example 2 | Ambient air | Air | 16 | 0.2 | 10 | 5.5 | 0.15 |
| Comparative Example 3 | Ambient air | $N_2$ | 0.8 | 0.2 | 10 | 10.0 | 0.10 |
| Comparative Example 4 | Ambient air | $N_2$ | 4 | 0.2 | 1 | 7.0 | 0.10 |
| Comparative Example 5 | Ambient air | $N_2$ | 4 | 0.2 | 4 | 6.0 | 0.05 |

(Evaluation Results)

In any of Examples 1 to 10, the defect area ratio at the indium-backing tube interface was 5.0% or less, the occurrence of defects in the indium target was well controlled, and the adhesion between the indium target and the backing tube was excellent.

In Example 10, raw material indium was supplied under an inert gas atmosphere, so that the occurrence of the indium oxide film of on the surface of the backing tube during casting was reduced. As a result, a better adhesion ratio was obtained in comparison with Example 1.

In any of Comparative Examples 1 to 5, the defect area ratio at the indium-backing tube interface exceeded 5.0%, defects occurred in the indium target, and the adhesion between the indium target and the backing tube was poor.

What is claimed is:

1. A laminate structure consisting of a cylindrical indium target and a backing tube, wherein the cylindrical indium target consists of indium and wherein the cylindrical indium target is cast directly onto the backing tube, and the cylindrical indium target and the backing tube are adjacent and form an indium-backing tube interface and wherein a defect area ratio at the indium-backing tube interface is between 0.05% and 5.0% and the indium-backing tube interface has internal defects having a diameter of 1 mm or more with a number less than 0.10 pieces/cm³.

2. The laminate structure according to claim 1, wherein the defect area ratio is between 0.05% and 3.0%.

3. The laminate structure according to claim 2, wherein the defect area ratio is between 0.05% and 1.0%.

4. A manufacturing method of the laminate structure of the indium target and the backing tube according to claim 1 comprising steps of:

disposing the backing tube inside a casting mold, and
melting and casting a raw material indium supplied to a gap between the casting mold and the backing tube inside the casting mold,
wherein in the melting and casting, an inert gas is blown into molten indium such that a slag containing oxides in the molten indium and/or a slag containing oxides adhered to the backing tube are floated to a top of the molten indium by bubbling and removed.

5. The manufacturing method of the laminate structure according to claim 4, wherein the melting and casting is performed in an atmosphere wherein an inert gas is used as the atmosphere.

6. The manufacturing method of the laminate structure according to claim 4, wherein of disposing the backing tube inside a casting mold comprises preparing the backing tube laminated with an indium layer and disposing the backing tube laminated with an indium layer inside the casting mold.

7. The manufacturing method of the laminate structure according to claim 4, wherein an amount of the inert gas blown into the molten indium for the bubbling is a flow rate Q [L/min] calculated according to the following formula:

$$Q=(T+273.2)/(T_1+273.2)\times(P_1/P)\times Q_1$$

wherein T[° C.] represents a temperature of the inert gas, P represents a pressure of the inert gas, $T_1$ is 25 [° C.], $P_1$ is 0.2 [MPa], and $Q_1$ is 1 to 40 [L/min].

8. The manufacturing method of the laminate structure according to claim 4, wherein the bubbling of the inert gas is performed for a time period of 5 minutes or more.

9. The manufacturing method of the laminate structure according to claim 7, wherein the inert gas for use in the bubbling is nitrogen, argon, or a mixed gas thereof.

* * * * *